(12) United States Patent
Chow et al.

(10) Patent No.: US 8,461,930 B2
(45) Date of Patent: Jun. 11, 2013

(54) MONOLITHIC MICROWAVE INTEGRATED CIRCUIT (MMIC) INCLUDING AIR BRIDGE COUPLER

(75) Inventors: Yut Hoong Chow, Penang (MY); Chin Eng Ong, Perak (MY); Dah Haur Tan, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 18 days.

(21) Appl. No.: 13/212,219

(22) Filed: Aug. 18, 2011

(65) Prior Publication Data
US 2013/0043954 A1    Feb. 21, 2013

(51) Int. Cl.
*H03F 3/60* (2006.01)
(52) U.S. Cl.
USPC .......................................... 330/286; 330/307
(58) Field of Classification Search
USPC .............. 330/286, 307; 333/1, 238, 243, 245, 333/246
See application file for complete search history.

(56) References Cited

U.S. PATENT DOCUMENTS

| 4,771,247 | A | 9/1988 | Jacomb-Hood |
| 5,157,357 | A | 10/1992 | Katoh |
| 5,166,639 | A | 11/1992 | Green et al. |
| 5,623,231 | A * | 4/1997 | Mohwinkel et al. .......... 330/276 |
| 7,489,197 | B2 | 2/2009 | Nilsson |
| 7,508,267 | B1 | 3/2009 | Yu et al. |
| 7,511,575 | B2 * | 3/2009 | Gotou et al. .................. 330/295 |

* cited by examiner

*Primary Examiner* — Steven J Mottola

(57) ABSTRACT

A monolithic microwave integrated circuit (MMIC) includes a transistor, coupled line and multiple air bridges. The coupled line is configured to output a coupled signal from the transistor, the coupled line running parallel to a drain of the transistor. The air bridges connect the drain of the transistor with a bond pad for outputting a transistor output signal, the bridges being arranged parallel to one another and extending over the coupled line. The air bridges and the coupled line effectively provide coupling of the transistor output signal to a load.

20 Claims, 8 Drawing Sheets

MONOLITHIC MICROWAVE INTEGRATED CIRCUIT (MMIC) INCLUDING AIR BRIDGE COUPLER

BACKGROUND

Microwave monolithic integrated circuit (MMIC) devices are widely used in microwave frequency applications, due to their relatively low cost and high degree of integration. For example, MMICs are incorporated into various wireless communication devices, such as cellular telephones, personal digital assistants and portable computers. MMICs may include power amplifiers, which typically consist of arrays of transistors coupled in parallel to form corresponding amplifier stages. The output of the final stage, which is typically a radio frequency (RF) signal, may be connected to a load through a coupler and an output impedance matching network.

Typically, the coupler is an edge line coupler, which may be implemented by running a coupled line parallel to another matched impedance line. FIG. 1 is a simplified block diagram application showing a conventional edge line coupler at the output of the amplifier. Referring to FIG. 1, MMIC 100 includes a power amplifier 110, the final stage of which is indicted by transistor 115. An (amplified) output signal of the power amplifier 110 is provided from drain 118 of the transistor 115, and is received by printed circuit board (PCB) circuit 142 of module PCB 140.

In the depicted example, the PCB circuit 142 includes output impedance matching circuit 144 and edge line coupler 146, the output of which is connected to load 150. The edge line coupler 146 includes coupled line 147 running in parallel with matched impedance line 148 having predetermined resistance 149, as mentioned above. The coupled line 147 may provide a coupled signal to an output detector (not shown), for example, which may determine a power level of the output of the power amplifier 110. The edge line coupler 146 typically would have 50 ohm input and output impedances. Conventional edge line couplers, such as the edge line coupler 146, provide good directivity, but they occupy a substantial amount of space relative to the size of the power amplifier 110 and/or the MMIC 100.

In cases where directivity is not critical, a conventional alternative to edge line couplers is a capacitive coupler located in the MMIC. FIG. 2 is a simplified block diagram showing a conventional capacitive coupler, in which MMIC 200 includes a power amplifier 210, the final stage of which is indicated by transistor 215, and coupling capacitor 219. An (amplified) output signal of the power amplifier 210 is provided from drain 218 of the transistor 215, and the coupling capacitor 219 is connected in series between the drain 218 and an output detector (not shown), for example. That is, the coupling capacitor 219 is connected directly at the drain 218 of the transistor 215, which is the last (or second to last) stage of the power amplifier 210.

The output signal of the power amplifier 210 is received by PCB circuit 242 of module PCB 240. The PCB circuit 242 includes output impedance matching circuit 244 connected to load 250, but no edge line coupler. Thus, the coupling capacitor 219 is able to approximate the coupling effect of an edge line coupler, using much less space than an edge line coupler, because the coupling capacitor 219 is implemented in the MMIC 200 itself.

However, the coupling capacitor 219 has limited coupling effect. The coupling capacitor 219 is usually a few tenths of a picoFarad (pF), hence it is located at one edge of the output stage gain device. For example, FIG. 3 is a top plan view showing a final stage of a conventional MMIC power amplifier and a corresponding coupling capacitor. Referring to FIG. 3, the final stage includes transistor 315, which includes gate 316, source 317 and drain 318. The drain 318 is connected to a bond pad 330 through multiple air bridges 325-1 to 325-$n$. Coupling capacitor 319 is connected to one edge of the bond pad 330. The coupling capacitor 319 is therefore able to provide only limited coupling.

While it uses little area, the coupling capacitor 319 has a number of drawbacks. For example, the coupling capacitor 319 only couples signals out from one end of the transistor 315, as discussed above, leading to erroneous sampling of actual power output from the power amplifier 310. Also, the coupling capacitor 319 is sensitive to variations in the output mismatch at the load (e.g., load 250 of FIG. 2). Variations in load impedance lead to large variations in the coupled signal output through the coupling capacitor 319.

SUMMARY

In a representative embodiment, a monolithic microwave integrated circuit (MMIC) includes a transistor, a coupled line and multiple air bridges. The coupled line is configured to output a coupled signal from the transistor, the coupled line running parallel to a drain of the transistor. The air bridges electrically connect the drain of the transistor with a bond pad for outputting a transistor output signal. The air bridges are arranged parallel to one another and extend over the coupled line, where the air bridges and the coupled line provide coupling of the transistor output signal to a load.

In another representative embodiment, an MMIC includes a multi-stage amplifier including a final stage and at least one previous stage, a first coupled line at the final stage of the multi-stage amplifier configured to provide a first coupled signal, and multiple first air bridges electrically connecting an output of the final stage to a bond pad for outputting a radio frequency (RF) signal from the of the multi-stage amplifier. The first air bridges extend over the first coupled line, where the first air bridges and the first coupled line couple the RF signal output from the multi-stage amplifier to a load.

In another representative embodiment, a coupling device in an MMIC, for coupling a power amplifier with a load, includes a coupled line and multiple air bridges. The coupled line is configured to provide a coupled signal from a transistor included in the power amplifier. The air bridges connect one of a drain or a collector of the transistor with a bond pad for outputting an RF signal from the power amplifier. The air bridges extend over the coupled line, where the air bridges and the coupled line couple the power amplifier to a load.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
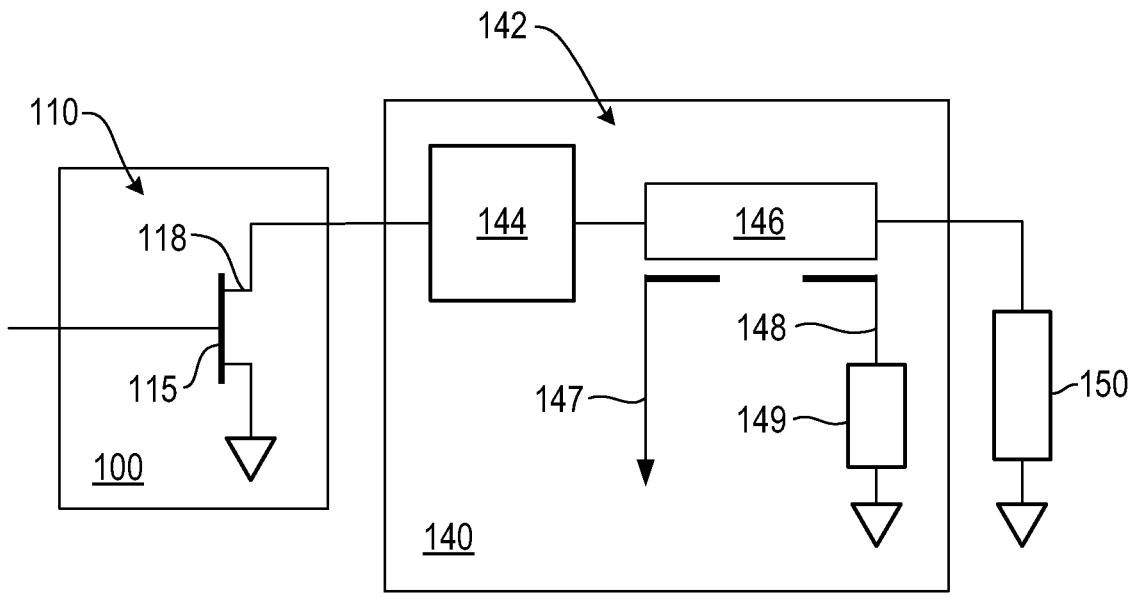
FIG. 1 is a simplified block diagram showing a conventional edge line coupler.
Figure 2:
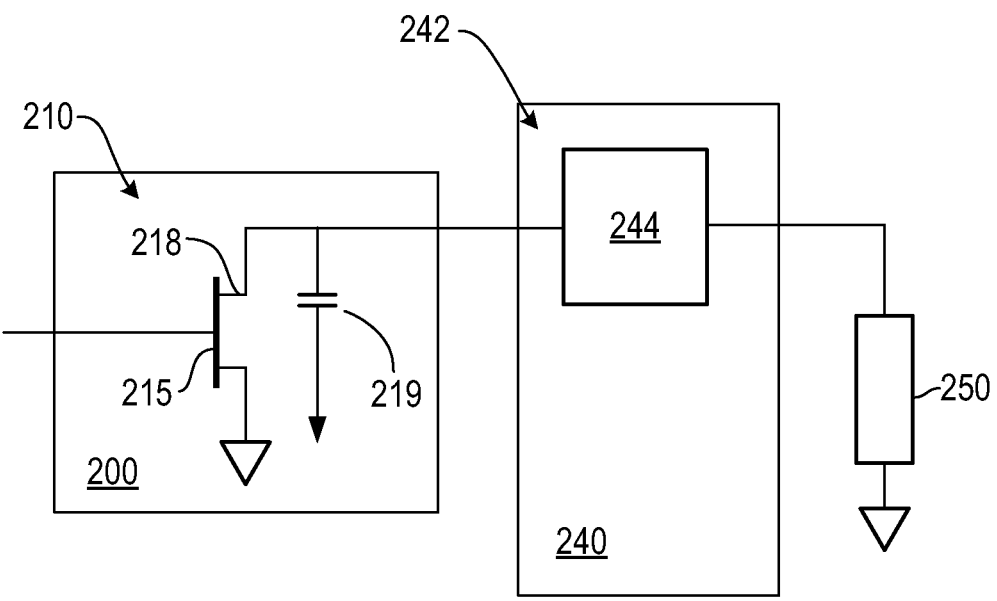
FIG. 2 is a simplified block diagram showing a conventional capacitive coupler included in a microwave monolithic integrated circuit (MMIC).

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

FIGS. 4A-4E are simplified block diagrams showing air bridge couplers included in MMICs, according to representative embodiments.

Figure 4A:
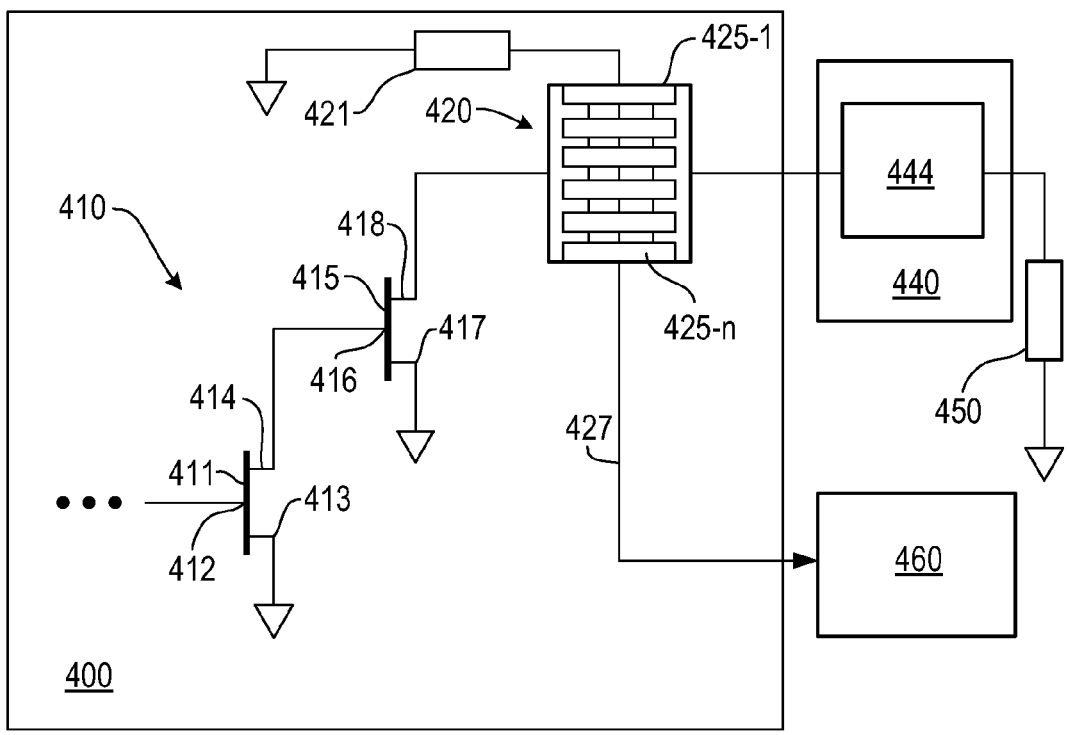
FIGS. 4A-4E are simplified block diagrams showing air bridge couplers included in MMICs, according to representative embodiments.

Referring to FIG. 4A, power amplifier 410 is included in MMIC 400, along with air bridge coupler 420. The amplifier 410 is a multi-stage amplifier, including at least two stages. In the depicted embodiment, the final stage of the multi-stage amplifier 410 includes second (or final stage) transistor 415 and first (or previous stage) transistor 411. However, it is understood that the amplifier 410 may include three or more stages (indicated by the dots preceding the input to the first transistor 411), or that the amplifier 410 may be a single stage amplifier, without departing from the scope of the present teachings.

For purposes of explanation, it may be assumed that each of the first and second transistors 411 and 415 is a field effect transistor (FET), such as a metal oxide semiconductor FET (MOSFET) or a metal semiconductor FET (MESFET). Accordingly, the first transistor 411 includes gate 412, source 413 connected to ground and drain 414 connected to the second transistor 415. The second transistor 415 includes gate 416, source 417 connected to ground and drain 418, which corresponds to the output of the amplifier 410.

However, it is understood that each of the first and second transistors 411 and 415 may be any of various alternative types of transistors, such as a high electron mobility transistor (HEMT), a pseudomorphic high electron mobility transistor (pHEMT), an enhancement-mode pseudomorphic high electron mobility transistor (E-pHEMT), a bipolar junction transistor (BJT), a heterojunction bipolar transistor (HBT), or the like, without departing from the scope of the present teaches. If the first and second transistors 411 and 415 were BJTs, for example, it is further understood that the first transistor 411 would include base 412, emitter 413 connected to ground and collector 414 connected to the second transistor 415, and the second transistor 415 would include base 416, emitter 417 connected to ground and collector 418. Likewise, it is understood that the sources (or emitters) and drains (or collectors) of the first and second transistors 411 and 415 may be reversed in alternative configurations.

The output signal of the amplifier 410 may be an amplified RF signal, output from the drain 418 of the second transistor 415. The output signal passes through the air bridge coupler 420, which is also located in the MMIC 400, along with the amplifier 410. The output signal is provided to load 450 via a module PCB 440, where the module PCB 440 includes an impedance matching circuit 444. The air bridge coupler 420 enables coupling of the output signal to the load 450.

In the depicted embodiment, the air bridge coupler 420 includes multiple air bridges 425-1 to 425-$n$ and coupled line 427, which passes through the space beneath each of the air bridges 425-1 to 425-$n$. As discussed below, the air bridges 425-1 to 425-$n$ may electrically connect the drain 418 to a bond pad (e.g., bond pad 430 in FIGS. 5A and 5B) or other electrical connection for providing the output signal from the amplifier 410. Generally, the air bridges 425-1 to 425-$n$ connect the drain 418 to bond pad 430, for example. The air bridges 425-1 to 425-$n$ may be substantially parallel to one another, and the coupled line 427 may run substantially perpendicular to the air bridges 425-1 to 425-$n$. The coupled line 427 is shown as having two ports, a first port being connected to output detector 460 and a second port being connected to ground through resistor 421. The output detector 460 may determine a power level of the output of the power amplifier 410, which may be used for system power level setting or amplifier linearization, for example.

It is understood that the first port and/or the second port of the coupled line 427 may be connected to various other devices, such as auxiliary amplifiers or other circuits used for linearization of the amplifier 410, and/or passive networks, such as resistance, capacitor and/or inductor circuits, without departing from the scope of the present teachings. For example, the second port of the coupled line 427 may be connected to an auxiliary amplifier while the first port is connected to the output detector 460. Also, the coupled line 427 may be connected to an input of another amplifier for driving the other amplifier. Alternative configurations are discussed below with reference to FIGS. 4B to 4E. It is further understood that, in various configurations, the air bridge coupler 420 may be connected to the output of one or more previous stages (e.g., the drain 414 of the first transistor 411) of the amplifier 410 instead of, or in addition to, being connected to the output of the final stage (e.g., the drain 418 of the second transistor 415) of the amplifier 410.

Figure 5A:
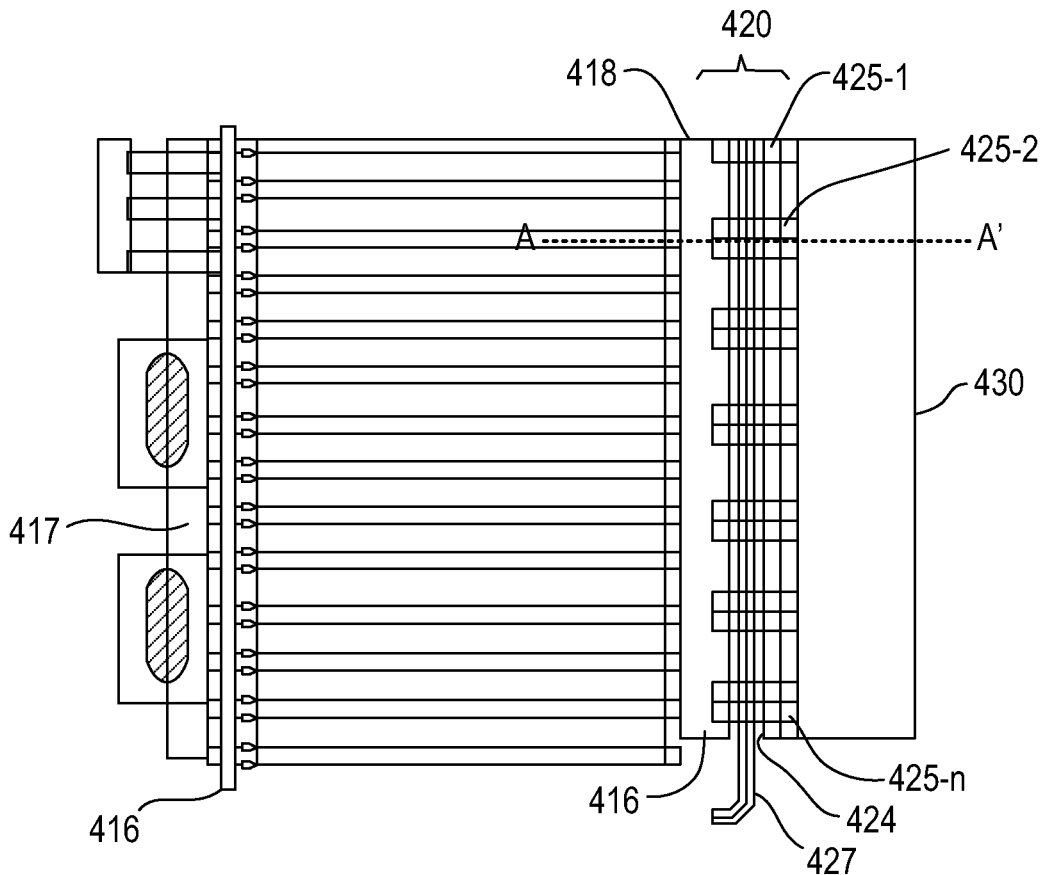
FIG. 5 is a top plan view of a transistor and air bridge coupler included in an MMIC, according to a representative embodiment.
Figure 5B:
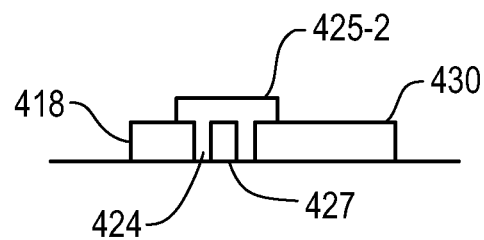

FIG. 5A is a top plan view of a transistor and an air bridge coupler included in an MMIC, and FIG. 5B is a cross-sectional view of the air bridge coupler of FIG. 5A taken along line A-A', according to a representative embodiment. More particularly, FIGS. 5A and 5B depict one example of the second transistor 415 and the air bridge coupler 420 of FIG.

4A, in more detail, where the second transistor 415 is depicted as a large FET, e.g., relative to the wavelength of the coupled signal.

Referring to FIG. 5A, the second transistor 415 includes gate 416, source 417 and drain 418, each of which is formed of conductive material, such as gold (Au), copper (Cu), aluminum (Al), and the like, or combinations thereof, and/or plated conductive material. The conductive material may be formed on a substrate, which may be various types of materials compatible with semiconductor processes, such as silicon (Si), GaAs, or the like, for example. The drain 418 is electrically connected to bond pad 430 via the multiple air bridges 425-1 to 425-n. In other words, the metallization of the drain 418 is connected to the metallization of the bond pad 430 via the conductive air bridges 425-1 to 425-n. The air bridges 425-1 to 425-n are likewise formed of conductive material, and may be formed of the same material as one or both of the drain 418 and the bond pad 430. As mentioned above, the air bridges 425-1 to 425-n are arranged substantially parallel to one another. Therefore, the gaps defined beneath the air bridges 425-1 to 425-n form channel 424, separating the drain 418 and the bond pad 430. The coupled line 427 extends beneath the air bridges 425-1 to 425-n, within the channel 424. Therefore, the coupled line 427 runs between the drain 418 and the bond pad 430, and is arranged substantially perpendicular to the air bridges 425-1 to 425-n. The coupled line 427 may be a conductive trace on the surface of the substrate, for example, formed of a conductive material, such as Au, Cu, Al, and the like, or combinations thereof.

As mentioned above, FIG. 5B shows a cross-sectional view of the air bridge coupler 420 taken along line A-A' of FIG. 5A. Referring to FIG. 5B, representative air bridge 425-2 is shown electrically connecting the drain 418 and the bond pad 430. The air bridge 425-2 forms a gap and corresponding channel 424, in which the coupled line 427 is arranged. As shown, the coupled line 427 does not come into physical contact with the air bridge 425-2, the drain 418 or the bond pad 430.

Figure 3:
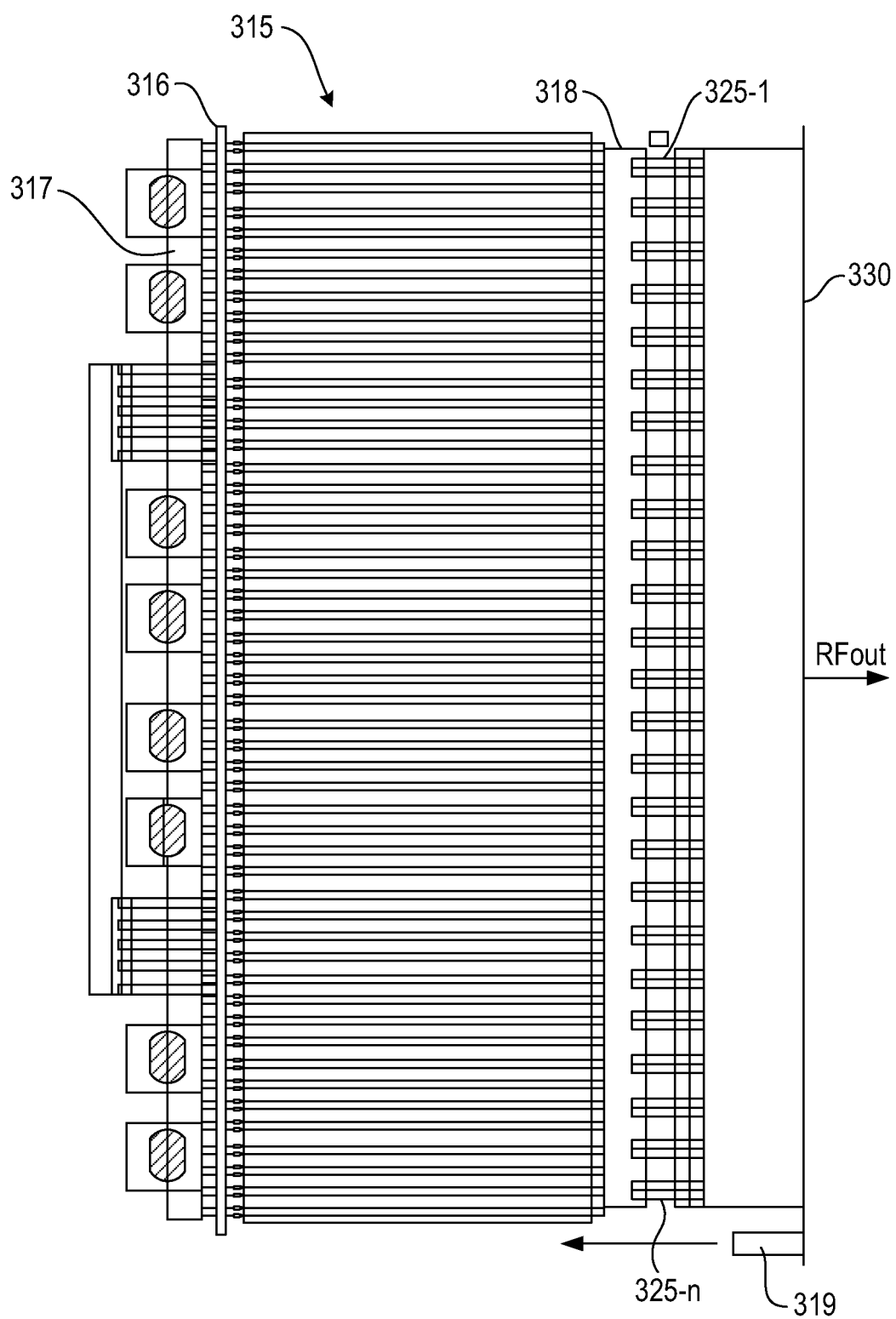
FIG. 3 is a top plan view of a conventional transistor and capacitive coupler included in an MMIC.

Generally, the air bridge coupler 420 is used to provide coupling to first level metallization of the MMIC. In the depicted configuration, the air bridge coupler 420 effectively acts as a distributed capacitor, where the air bridges 425-1 to 425-n collectively act as a top plate and the coupled line 427 acts as a bottom plate of the distributed capacitor. Significantly, the coupled line 427 extends along the entire length of the second transistor 415, parallel to the drain 418. Therefore, unlike a conventional capacitance coupler, the air bridge coupler 420 is able to couple out the output signal from the entire (large) transistor 415, without taking up additional space within the MMIC. In other words, the output signal of the transistor 415 is sampled across the entire length of the connection of the drain 418. In comparison, a conventional capacitance coupler, as shown in FIG. 3, for example, pulls the coupled output signal from one corner of the large transistor, which leads to erroneous sampling. The air bridge coupler 420 is also less sensitive to variations in output mismatch at the load, and the coupling coefficient is easily and accurately controllable, as discussed below with reference to FIG. 6.

Figure 6:
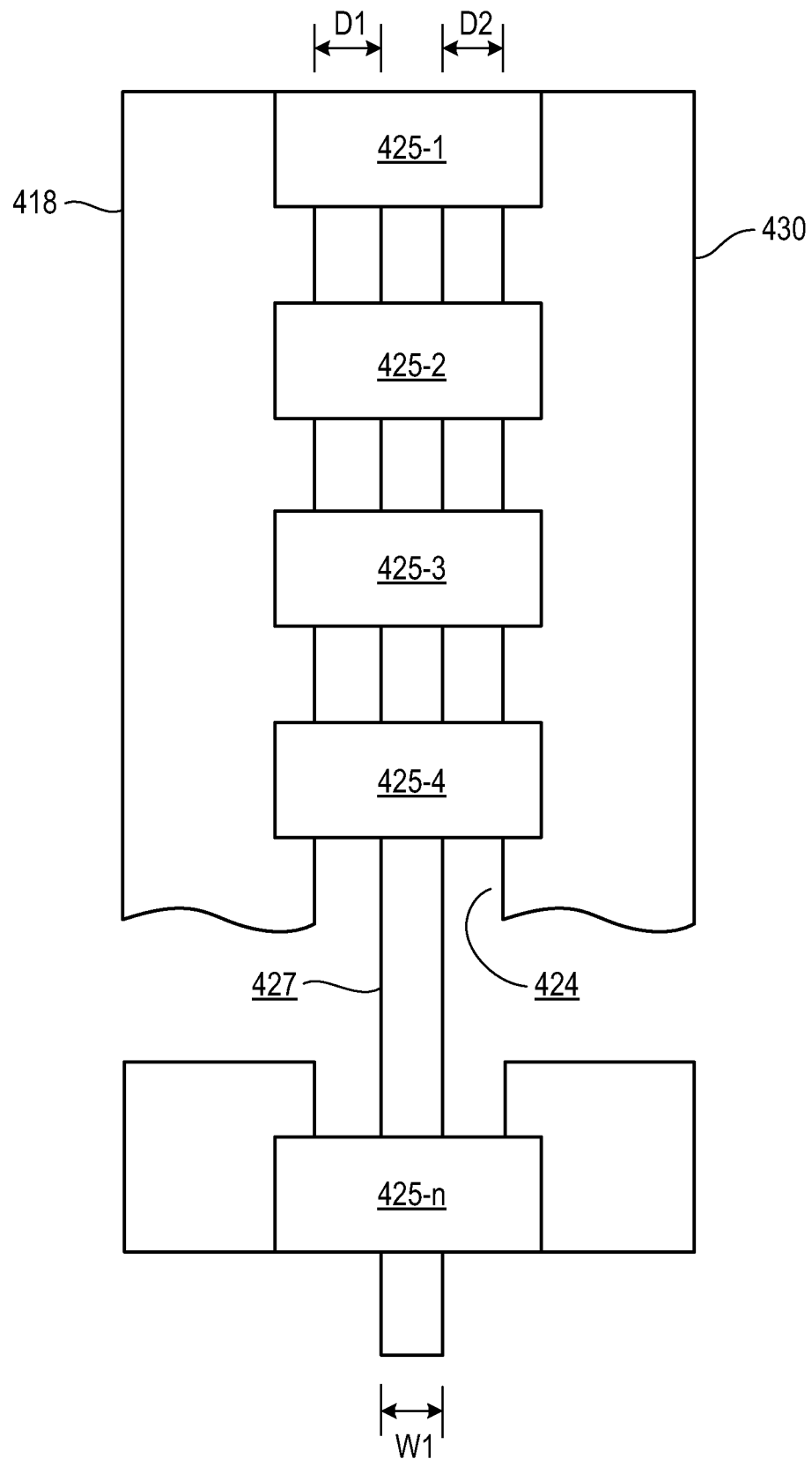
FIG. 6 is a simplified block diagram of an air bridge coupler included in an MMIC, according to a representative embodiment.

FIG. 6 is a simplified block diagram of an air bridge coupler included in an MMIC, according to a representative embodiment. More particularly, FIG. 6 depicts an illustrative configuration of the air bridge coupler 420, discussed above.

Referring to FIG. 6, the air bridge coupler 420 includes representative air bridges 425-1, 425-2, 425-3, 425-4 . . . 425-n, which electrically connect the drain 418 of the second transistor 415 and the bond pad 430. The air bridges 425-1, 425-2, 425-3, 425-4 . . . 425-n are arranged substantially parallel to one another, and form channel 424 between the drain 418 and the bond pad 430. Although only five air bridges are depicted, it is understood that the total number may vary to provide unique benefits for particular situations or to meet application specific design requirements of the implementations, as would be apparent to one of ordinary skill in the art. The coupled line 427 runs substantially perpendicular to the air bridges 425-1, 425-2, 425-3, 425-4 . . . 425-n within the channel 424. The coupled line 427 has width W1, and is separated from the drain 418 by distance D1 and from the bond pad 430 by distance D2.

As mentioned above, the coupling coefficient of the coupling between the amplifier 410 and the detector 460 and/or feedback signals in the coupled line 427 is adjustable in response to changes in the configuration of the air bridge coupler 420. For example, the coupling coefficient is directly proportional to the number of air bridges 425-1 to 425-n. That is, the coupling coefficient increases as the number of air bridges 425-1 to 425-n increases and decreases as the number of air bridges 425-1 to 425-n decreases. The coupling coefficient is also directly proportional to the width W1 of the coupled line 427. That is, the coupling coefficient increases as the width W1 of the coupled line 427 increases, and decreases as the width W1 of the coupled line 427 decreases.

The coupling coefficient is indirectly proportional to the proximity of the coupled line 427 with each of the drain 418, the bond pad 430 and the air bridges 425-1 to 425-n. That is, the coupling coefficient increases as the distance D1 between the coupled line 427 and the drain 418 and/or the distance D2 between the coupled line 427 and the bond pad 430 decreases, and the coupling coefficient decreases as the distance D1 between the coupled line 427 and the drain 418 and/or the distance D2 between the coupled line 427 and the bond pad 430 increases. Similarly, the coupling coefficient increases as the distance (not shown in FIG. 6) between the coupled line 427 and the air bridges 425-1 to 425-n (above the coupled line 427) decreases, and the coupling coefficient decreases as the distance between the coupled line 427 and the air bridges 425-1 to 425-n increases. Of course, the coupling coefficient would be affected by other factors, as well, such as frequency of the output signal and the type of material filling the gap between the air bridges 425-1 to 425-n and the coupled line 427. For example, the coupling coefficient is minimum when the gap is a vacuum or is filled with air, and is higher when the gap is filled with silicon nitride, or other dielectric material.

As mentioned above, the air bridge coupler 420 may be incorporated into any number of various configurations, an example of which is depicted in FIG. 4A, discussed above. FIGS. 4B-4E are simplified block diagrams showing additional illustrative configurations of air bridge couplers included in MMICs, according to representative embodiments.

Figure 4B:
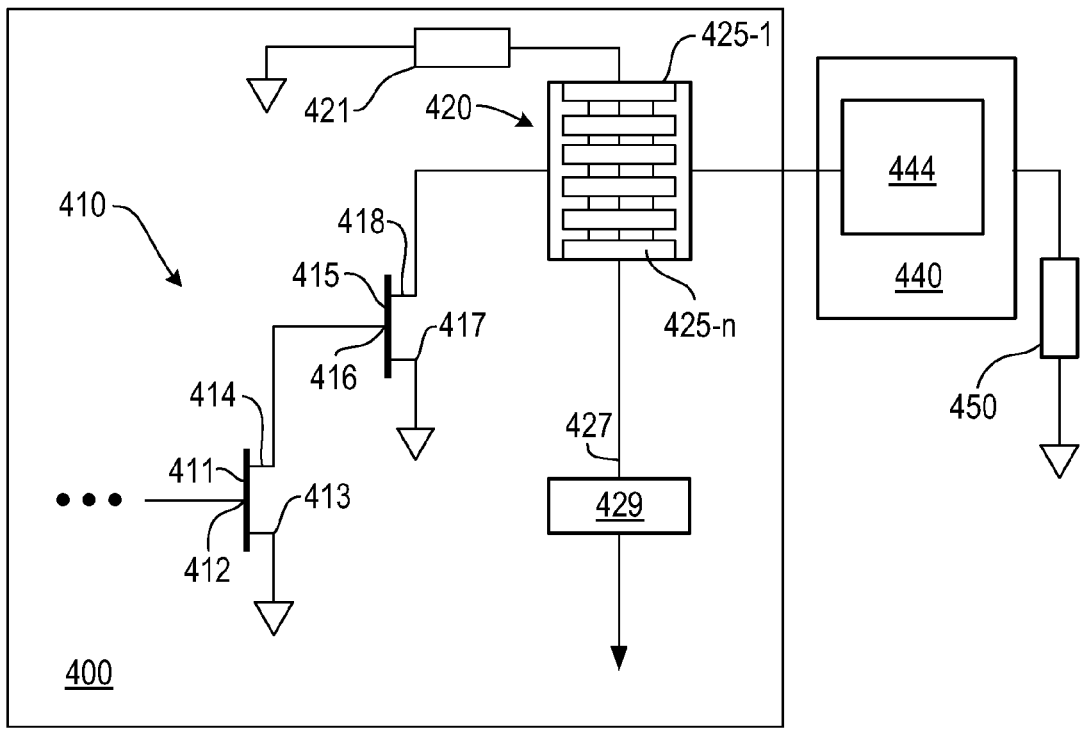

Referring to FIG. 4B, power amplifier 410 is included in MMIC 400, along with air bridge coupler 420. In the depicted embodiment, the amplifier 410 is a multi-stage amplifier, including first and second transistors 411 and 415. The output signal (e.g., amplified RF signal) of the amplifier 410 is output at the drain 418 of the second transistor 415. As discussed above with respect to FIG. 4A, the output signal passes through the air bridge coupler 420, located in the MMIC 400, which provides coupling between the amplifier 410 and the load 450 via the module PCB 440.

The air bridge coupler 420 includes multiple air bridges 425-1 to 425-n and coupled line 427, which passes through the space beneath each of the air bridges 425-1 to 425-n. In the embodiment depicted in FIG. 4B, the coupled line 427 is connected to feedback network 429 leading to a signal processing circuit, as opposed to the output detector 460, such that the coupled signal in the coupled line 427 provides feedback. For example, the signal processing circuit may include the input of a different stage of the amplifier 410 or some digital processing circuit (not shown). That is, the feedback network 429 may provide feedback to the input of the first transistor 411, for example, in which case a first port of the coupled line 427 may be connected to the gate 412 of the first transistor 411, and a second port of the coupled line 427 may be connected to ground through resistor 421. Other examples include the coupled line 427 being connected to the final stage of the amplifier 410 (e.g., the gate 416 of the second transistor 415) via the feedback network 429, or when the amplifier 410 includes more than two stages, the coupled line 427 being connected to another previous stage of the amplifier 410, without departing from the scope of the present teachings.

Figure 4C:
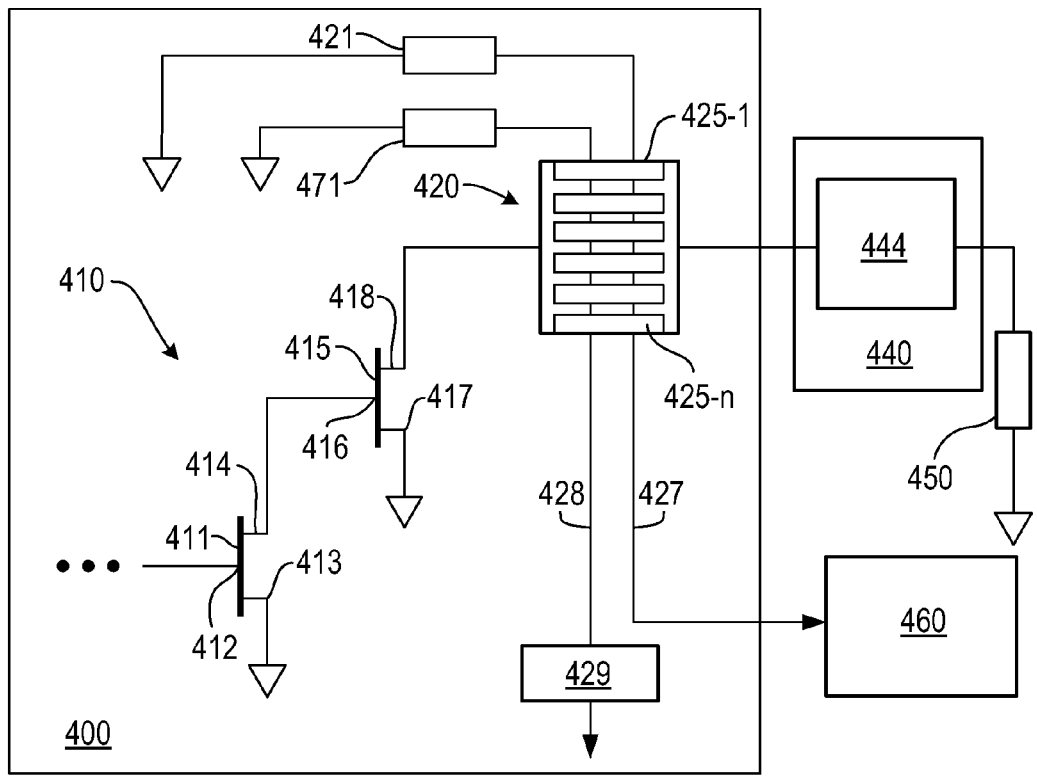
Figure 4D:
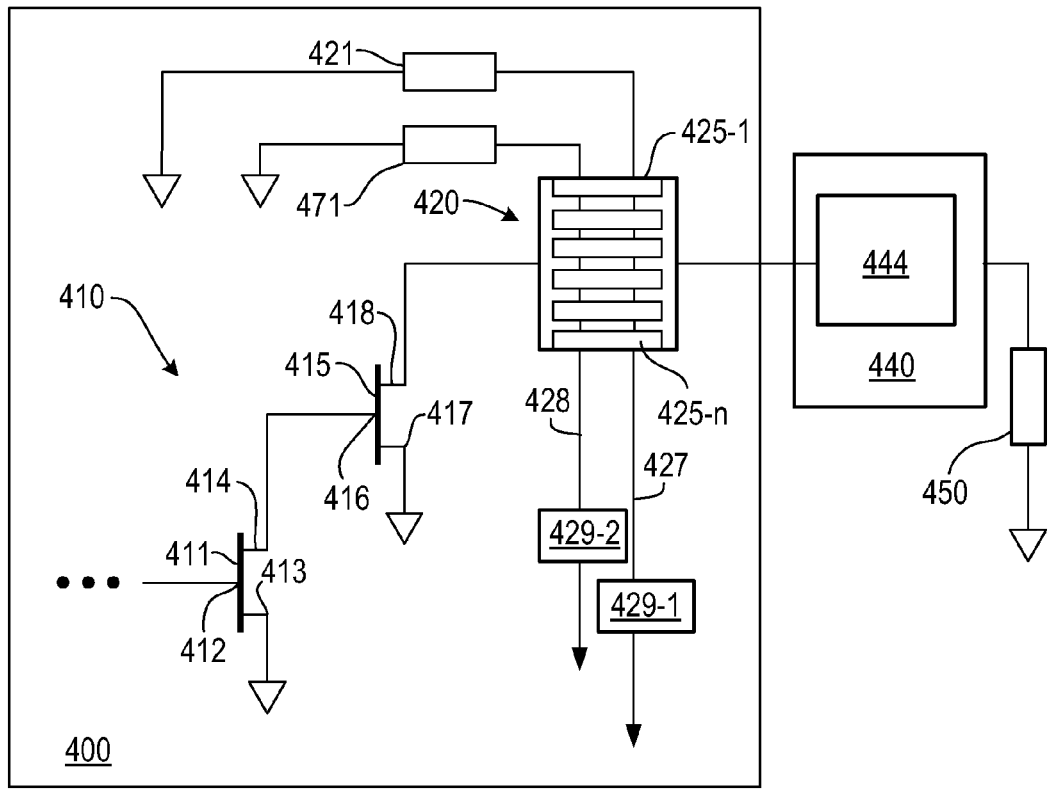

FIGS. 4C and 4D are similar to FIGS. 4A and 4B, except that the air bridge coupler 420 includes multiple coupled lines, indicated by representative first and second coupled lines 427 and 428. The first and second coupled lines 427 and 428 run substantially parallel to one another, and are arranged within the channel 424 beneath the air bridges 425-1 to 425-$n$ of the air bridge coupler 420. Therefore, both of the first and second coupled lines 427 and 428 are substantially perpendicular to the air bridges 425-1 to 425-$n$, as discussed above. The first and second coupled lines 427 and 428 carry corresponding coupled signals. The configuration and effects of the second coupled line 428 (and corresponding coupled signal) are essentially the same as those discussed above with reference to the first coupled line 427. The second coupled line 428 may be positioned beside the first coupled line 427 within the channel 424 (on the substrate), or it may be positioned above or below the first coupled line 427 within the channel 424, without departing for the scope of the present teachings. Notably, as in the case of the first coupled line 427, the coupling coefficient varies directly proportionally to the width of the second coupled line 428 and indirectly proportionally to the proximity of the second coupled line 428 with each of the drain 418, the bond pad 430, and the air bridges 425-1 to 425-$n$. The overall coupling coefficient would depend on the aggregate effect of both of the first and second coupled lines 427 and 428 (as well as the number of air bridges 425-1 to 425-$n$, the material filling the gap, etc.), for example.

Referring to FIG. 4C, the first coupled line 427 has a first port connected to the output detector 460 and a second port connected to ground through resistor 421. The second coupled line 428 has a third port connected to feedback network 429 to provide feedback to any of a variety of possible signal processing circuits, as discussed above, and a fourth port connected to ground through resistor 421. Referring to FIG. 4D, the first coupled line 427 has a first port connected to first feedback network 429-1 to provide feedback to a first signal processing circuit and a second port connected to ground through resistor 421. The second coupled line 428 has a third port connected to second feedback network 429-2 to provide feedback to a second signal processing circuit (which may be the same as or different from the first signal processing circuit) and a fourth port connected to ground through resistor 421.

Also, as discussed above with reference to FIG. 4A, it is understood that the first through fourth ports may be connected to various other devices, such as auxiliary amplifiers or other circuits used for linearization of the amplifier 410, and/or passive networks, such as resistance, capacitor and/or inductor circuits, without departing from the scope of the present teachings.

Figure 4E:
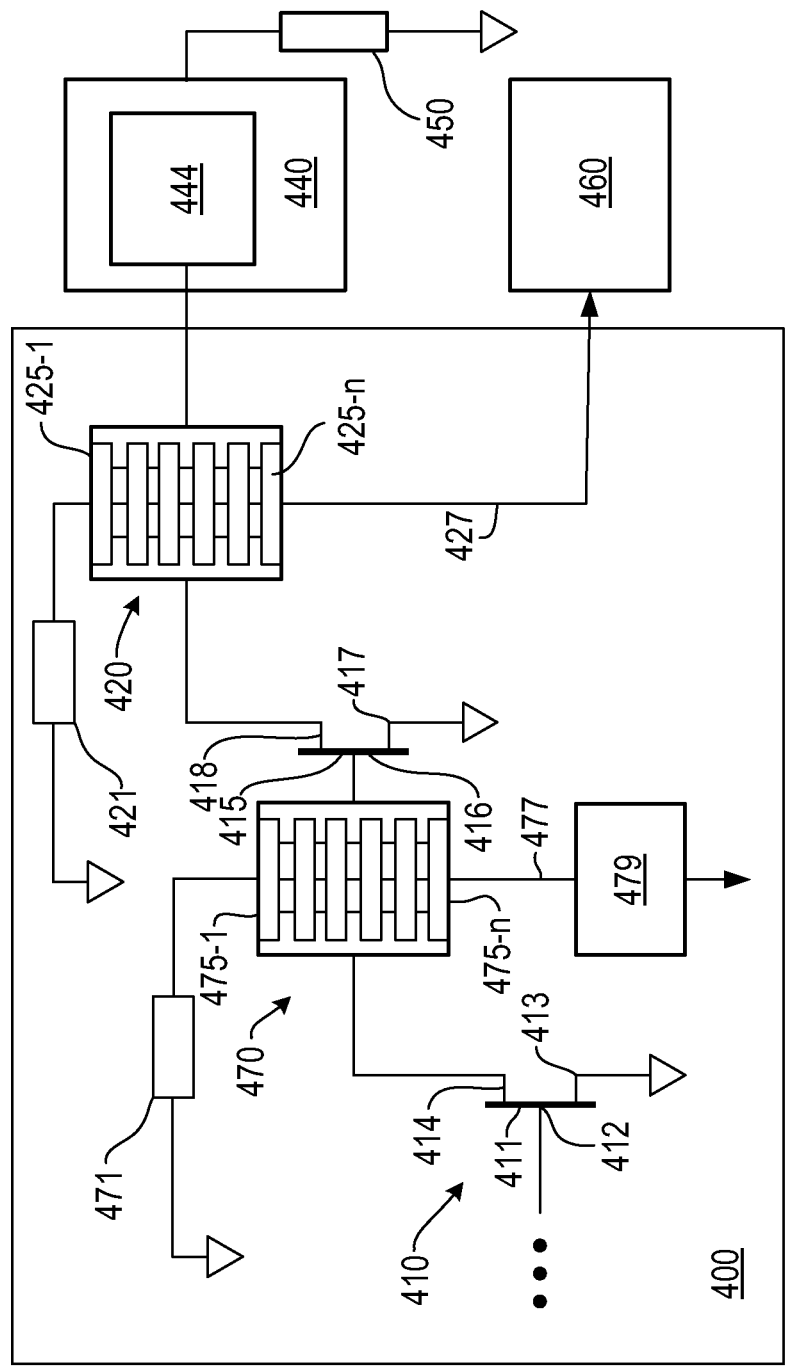

FIG. 4E is similar to FIGS. 4A-4D, except that the MMIC 400 includes a second air bridge coupler 470, in addition to air bridge coupler 420, and corresponding coupled lines, indicated by representative first and second coupled lines 427 and 428. Referring to FIG. 4E, power amplifier 410 is included in MMIC 400, along with air bridge couplers 420 and 470. In the depicted embodiment, the amplifier 410 is a multi-stage amplifier, including first and second transistors 411 and 415. The output signal (e.g., amplified RF signal) of the amplifier 410 is output at the drain 418 of the second transistor 415. As discussed above with respect to FIG. 4A, the output signal passes through the air bridge coupler 420, located in the MMIC 400, which provides coupling between the amplifier 410 and the load 450 via the module PCB 440. The air bridge coupler 420 includes multiple air bridges 425-1 to 425-$n$ and coupled line 427, which passes through the space beneath each of the air bridges 425-1 to 425-$n$. In the embodiment depicted in FIG. 4E, the coupled line 427 is connected to output detector 460, as discussed above.

In addition, an output signal from the first transistor 411, output from the drain 414, passes through the second air bridge coupler 470, also located in the MMIC 400. The air bridge coupler 470 includes multiple air bridges 475-1 to 475-$n$ and coupled line 477, which passes through the space beneath each of the air bridges 475-1 to 475-$n$. The configuration and functionality of the air bridge coupler 470 is substantially the same as that discussed above with regard to the air bridge coupler 420. In embodiment depicted in FIG. 4E, the coupled line 477 is connected to feedback network 479 leading to a signal processing circuit, such that the coupled signal in the coupled line 477 provides feedback. For example, the signal processing circuit may include the input of a different stage of the amplifier 410 or some digital processing circuit (not shown). That is, the feedback network 479 may provide feedback to the input of an earlier stage transistor (not shown), for example, in which case a first port of the coupled line 477 may be connected to the gate of the earlier stage transistor, and a second port of the coupled line 477 may be connected to ground through resistor 471. Notably, in various configurations, the air bridge coupler 470 may include features discussed above with regard to air bridge coupler 420, such as the inclusion of one or more additional coupled lines (along with the coupled line 477) and/or connection to an output detector (such as output detector 460).

Figure 7A:
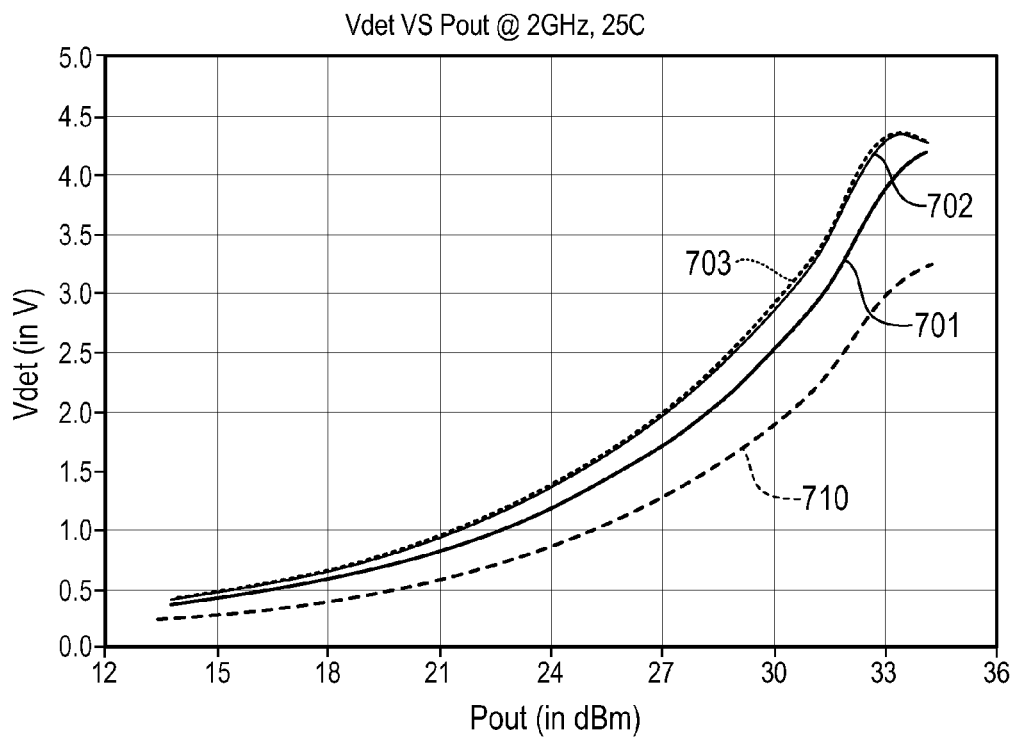
FIGS. 7A-7B are plots comparing conventional capacitive couplers and air bridge couplers included in an MMIC, according to a representative embodiment.
Figure 7B:
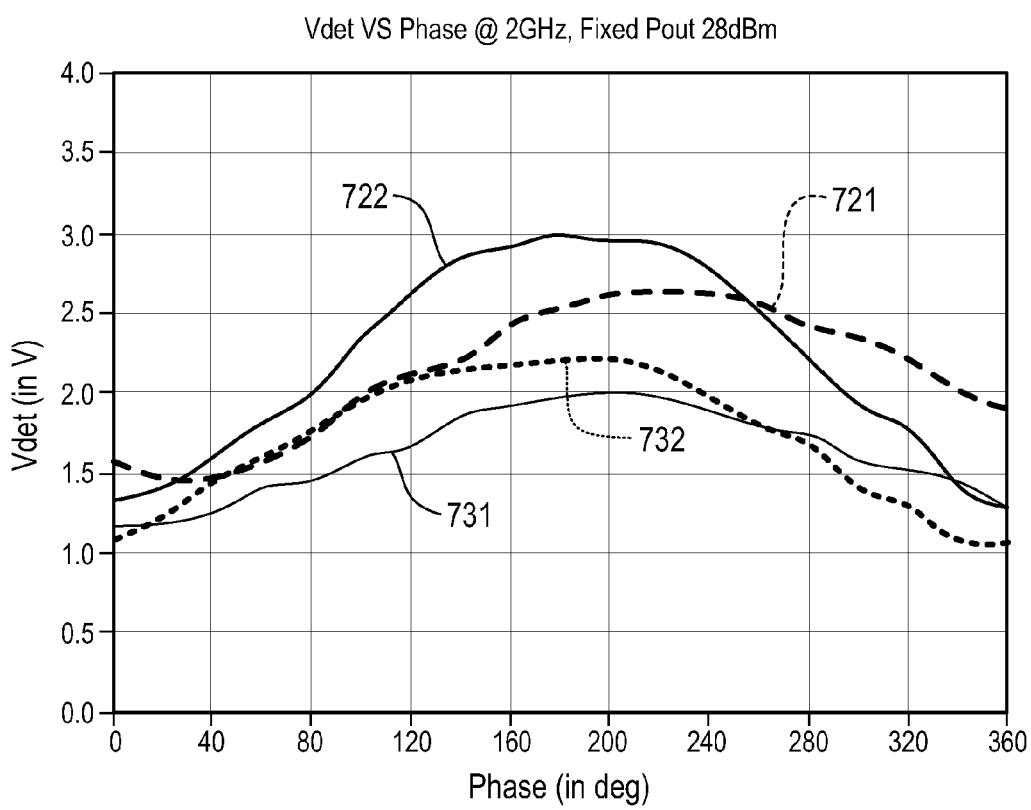

FIGS. 7A-7B are plots comparing conventional capacitive couplers and an air bridge coupler included in an MMIC, according to a representative embodiment.

FIG. 7A shows actual measured output when each of the conventional capacitive couplers and the air bridge coupler is connected to an output detector. For purposes of the measurement, the output signal had a frequency of about 2.0 GHz, the size of the gain device (e.g., the length of the drain) was about 28 mm, and the ambient temperature was about 25° C. The output of the output detector is plotted as output voltage (y-axis) versus output power (x-axis), where curves 701-703 correspond to conventional capacitive couplers having capacitances of 0.5 pF, 1.0 pF and 1.5 pF, respectively, and curve 710 corresponds to an air bridge coupler, according to a representative embodiment. As shown FIG. 7A, the air bridge coupler coupling coefficient is lower than that of the capacitive coupler in this particular embodiment. However, as mentioned above, the coupling coefficient can be easily increased if necessary.

FIG. 7B shows effects of the output detector connected to conventional capacitive couplers and the air bridge coupler when the voltage standing wave ratio (VSWR) of the load is varied across 360° of phase angles, and the VSWRs are set to 2:1 and 4:1. For purposes of the measurement, the output signal had a frequency of about 2.0 GHz, the size of the gain device (e.g., the length of the drain) was about 28 mm, and the fixed output power Pout was about 28 dBm. The output of the output detector is plotted as output voltage (y-axis) versus phase (x-axis). Curves 721-722 correspond to conventional capacitive couplers having a capacitance of about 0.5 pF, and where the VSWRs are 1:2 and 1:4, respectively. Curves 731-732 correspond to air bridge couplers, according to a representative embodiment, where the VSWRs are 1:2 and 1:4, respectively. As shown in FIG. 7B, the air bridge coupler has about half the variation across various load phase angles as the conventional capacitor couplers when the VSWR is high.

According to various embodiments, an air bridge coupler included in an MMIC enables improved coupling between the MMIC and a load, without increasing space needed to accommodate the coupling circuit. This enables the MMIC to remain relatively small, while improving operational characteristics and reliability. For example, the air bridge coupler may be easily incorporated into various MMIC layouts to provide a means to sense the actual output power of a gain device, e.g., for multi-stage amplifier designs. Also, both ends of the coupled signal (e.g., the first and second ports of the coupled line 427) may be used to equalize the output power distribution of a physically large transistor (e.g., FET). For example, phase variations fed into a large FET gate may cause loss of output power. However, the air bridge coupler described herein is able to feed the coupled signal back to provide a power sensing means, such as output detector 460, to improve power delivery from across the entire transistor. Further, the air bridge coupler may be used as means to inject power into the output of a power amplifier, such as amplifier 410, via an auxiliary amplifier for distortion cancellation purposes. Accordingly, the power injection would be uniformly coupled into the transistor output (e.g., along the entire length of drain 418), such that combining at the output matching network (e.g., output impedance matching circuit 444) is consistent.

The various components, materials, structures and parameters are included by way of illustration and example only and not in any limiting sense. For example, although various representative embodiments were discussed assuming that the MMIC included an amplifier, this configuration is described only for purposes of illustration. It is therefore understood that air bridge couplers as described herein may be included in other types of MMICs, without departing from the scope of the present teachings. In view of this disclosure, those skilled in the art can implement the present teachings in determining their own applications and needed components, materials, structures and equipment to implement these applications, while remaining within the scope of the appended claims.

The invention claimed is:

1. A monolithic microwave integrated circuit (MMIC), comprising:
    a transistor;
    a coupled line configured to output a coupled signal from the transistor, the coupled line running parallel to a drain of the transistor; and
    a plurality of air bridges electrically connecting the drain of the transistor with a bond pad for outputting a transistor output signal to a load, the plurality of air bridges being arranged parallel to one another and extending over the coupled line for providing the coupled signal to the coupled line by coupling the transistor output signal.

2. The MMIC of claim 1, wherein the plurality of air bridges and the coupled line form a distributed capacitor running a length of the drain of the transistor.

3. The MMIC of claim 1, wherein the coupling occurs at a first level metallization in the MMIC.

4. The MMIC of claim 1, wherein increasing the number of air bridges of the plurality of air bridges increases a coupling coefficient of the coupling.

5. The MMIC of claim 1, wherein increasing a width of the coupled line increases a coupling coefficient of the coupling.

6. The MMIC of claim 1, wherein decreasing a distance between the coupled line and one of metallization of the drain or metallization of the bond pad increases a coupling coefficient of the coupling.

7. The MMIC of claim 1, wherein decreasing a distance between the coupled line and the plurality of air bridges increases a coupling coefficient of the coupling.

8. A monolithic microwave integrated circuit (MMIC), comprising:
    a multi-stage amplifier comprising a final stage and at least one previous stage;
    a first coupled line at the final stage of the multi-stage amplifier configured to provide a first coupled signal; and
    a plurality of first air bridges electrically connecting an output of the final stage to a bond pad for outputting a radio frequency (RF) signal from the of the multi-stage amplifier to a load, the plurality of first air bridges extending over the first coupled line for providing the first coupled signal to the first coupled line from the RF signal output from the multi-stage amplifier to.

9. The MMIC of claim 8, wherein the first coupled line is connected to an output detector configured to determine a power level of the RF signal output by the multi-stage amplifier.

10. The MMIC of claim 8, wherein the first coupled line is connected to a feedback network leading to a signal processing circuit comprising the at least one previous stage for providing a feedback signal to the at least one previous stage.

11. The MMIC of claim 8, wherein the first coupled line is connected to an input of another amplifier for driving the other amplifier.

12. The MMIC of claim 8, further comprising:
    a second coupled line at the final stage of the multi-stage amplifier configured to provide a second coupled signal, wherein the second coupled line runs parallel to the first coupled line and the plurality of first air bridges also extends over the second coupled lines for providing the second coupled signal to the second coupled line.

13. The MMIC of claim 12, wherein the first coupled line is connected to an output detector configured to determine a power level of the RF signal output by the multi-stage amplifier based on the first coupled signal, and
    wherein the second coupled line is connected to a feedback network leading to a signal processing circuit comprising the at least one previous stage for providing a feedback signal to the at least one previous stage based on the second coupled signal.

14. The MMIC of claim 8, further comprising:
    a second coupled line at the at least one previous stage of the multi-stage amplifier configured to provide a second coupled signal; and
    a plurality of second air bridges connecting an output of the at least one previous stage to an input of the final stage of the multi-stage amplifier, the plurality of second air bridges extending over the second coupled line.

15. The MMIC of claim 14, wherein the second coupled line is connected to an output detector configured to determine a power level of a signal output by the at least one previous stage of the multi-stage amplifier.

16. A coupling device, included in a monolithic microwave integrated circuit (MMIC), for coupling a power amplifier with a load, the coupling device comprising:
- a coupled line configured to provide a coupled signal from a transistor included in the power amplifier; and
- a plurality of air bridges connecting one of a drain or a collector of the transistor with a bond pad for outputting a radio frequency (RF) signal from the power amplifier to a load, the plurality of air bridges extending over the coupled line for providing the coupled signal to the coupled line.

17. The coupling device of claim 16, wherein the coupled line comprises a plurality of coupled ports, at least one coupled port being connected to an output detector.

18. The coupling device of claim 17, wherein the output detector is configured to sample power output by the transistor across an entire length of the drain or collector via the coupled line, and to convert the sampled output power to a DC signal.

19. The coupling device of claim 16, wherein a coupling coefficient is controllable by adjusting a number of air bridges in the plurality of air bridges.

20. The coupling device of claim 16, wherein a coupling coefficient is controllable by adjusting a distance of the coupled line from at least one of the plurality of air bridges, the drain or collector of the transistor, and the bond pad.

* * * * *